United States Patent
Zocher et al.

(10) Patent No.: US 10,326,531 B2
(45) Date of Patent: *Jun. 18, 2019

(54) OUT-OF-BAND SIGNAL DETECTION (71) Applicant: FINISTAR CORPORATION, Sunnyvale, CA (US)

(72) Inventors: Andrew Zocher, Monticello, IL (US); Theron Jones, White Heath, IL (US); Lucy Hosking, Santa Cruz, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/134,913

(22) Filed: Sep. 18, 2018

(65) Prior Publication Data

US 2019/0020420 A1 Jan. 17, 2019

Related U.S. Application Data

(63) Continuation of application No. 15/233,730, filed on Aug. 10, 2016, now Pat. No. 10,079,644.

(60) Provisional application No. 62/203,203, filed on Aug. 10, 2015.

(51) Int. Cl.
*H04B 10/60* (2013.01)
*H04B 10/69* (2013.01)
*H03F 3/08* (2006.01)
*H04Q 11/00* (2006.01)

(52) U.S. Cl.
CPC ............... *H04B 10/60* (2013.01); *H03F 3/08* (2013.01); *H04B 10/69* (2013.01); *H04Q 2011/0088* (2013.01)

(58) Field of Classification Search
None
See application file for complete search history.

(56) References Cited

U.S. PATENT DOCUMENTS 10,079,644 B2 * 9/2018 Zocher ...................... H03F 3/08
2010/0054733 A1 * 3/2010 Hosking ............ H04B 10/0779
398/25
2010/0254711 A1 * 10/2010 Miller ..................... H03F 3/087
398/136

* cited by examiner

*Primary Examiner* — Kenneth N Vanderpuye
*Assistant Examiner* — David W Lambert
(74) *Attorney, Agent, or Firm* — Maschoff Brennan (57) ABSTRACT

An out-of-band (OOB) signal detector is disclosed. The OOB signal detector may include a first node configured to receive an alternating current (AC) portion and a direct current (DC) portion of an electrical signal. The AC portion may include modulated OOB data carried by the electrical signal. The OOB signal detector may also include a current to voltage processing circuit configured to extract the AC portion of the electrical signal. The OOB signal detector may additionally include a limiting amplifier circuit configured to receive the extracted AC portion and to generate an amplified signal based on the extracted AC portion. The OOB signal detector may further include an analog-to-digital convertor circuit configured to sample the amplified signal and to generate a digital sample that represents the modulated OOB data.

20 Claims, 5 Drawing Sheets

OUT-OF-BAND SIGNAL DETECTION

CROSS-REFERENCE TO RELATED APPLICATION

This patent application is a Continuation of U.S. patent application Ser. No. 15/233,730, filed Aug. 10, 2016, which claims the benefit and priority to U.S. Provisional Patent Application Ser. No. 62/203,203, filed Aug. 10, 2015, both which are incorporated herein by reference in their entireties.

FIELD

The present disclosure relates to out-of-band signal detection.

BACKGROUND

Out-of-band (OOB) signals may be part of communication systems. OOB signals may be used to send data regarding the strength, quality, or other status of a data signal and/or a data channel that carries the data signal. The data may be used to monitor the data signal and/or the data channel. Monitoring the data signal and/or the data channel may allow for adjustments to the data signal and/or the data channel to reduce power usage, increase signal-to-noise-ratio, among adjustments for other reasons.

The subject matter claimed herein is not limited to embodiments that solve any disadvantages or that operate only in environments such as those described above. Rather, this background is only provided to illustrate one example technology area where some embodiments described herein may be practiced.

SUMMARY

A method to detect an out-of-band signal is disclosed. The method may include receiving an electrical signal comprising an alternating current (AC) portion and a direct current (DC) portion. The AC portion may include modulated out-of-band data carried by the electrical signal. The method may also include extracting the AC portion of the electrical signal and applying a gain to the extracted AC portion of the electrical signal to generate an amplified signal. An amplitude of the amplified signal may be limited to a particular range and may vary based on the AC portion of the electrical signal and not based on the DC portion of the electrical signal. The method may also include sampling the amplified signal to generate a digital sample that represents the modulated out-of-band data.

An optical receiver that includes an out-of-band signal detector is disclosed. The optical receiver may include a photodiode including an anode and a cathode. The photodiode may be configured to receive an optical in-band signal and an optical out-of-band signal from an optical cable and to generate an electrical signal based on the out-of-band optical signal. The optical receiver may also include a current to voltage processing circuit that includes multiple current mirror circuits. The current to voltage processing circuit may be electrically coupled to the cathode and configured to extract a modulated out-of-band data signal from the electrical signal. The optical receiver may further include a limiting amplifier circuit electrically coupled to the multiple current mirror circuits and configured to receive the extracted modulated out-of-band data signal. The limiting amplifier circuit may apply a gain to the extracted modulated out-of-band data signal to generate an amplified signal. Additionally, the optical receiver may include a demodulation circuit electrically coupled to the limiting amplifier circuit. The demodulation circuit may be configured to demodulate the out-of-band data signal included in the amplified signal.

An out-of-band signal detector is also disclosed. The out-of-band signal detector may include a first node configured to receive an alternating current (AC) portion and a direct current (DC) portion of an electrical signal. The AC portion may include modulated out-of-band data carried by the electrical signal. The out-of-band signal detector may also include a current to voltage processing circuit electrically coupled to the first node and configured to extract the AC portion of the electrical signal. The out-of-band signal detector may further include a limiting amplifier circuit electrically coupled to the current to voltage processing circuit. The limiting amplifier circuit may be configured to receive the extracted AC portion and to generate an amplified signal based on the extracted AC portion. Additionally, the out-of-band signal detector may include an analog-to-digital convertor circuit electrically coupled to the limiting amplifier circuit. The analog-to-digital convertor may be configured to sample the amplified signal and to generate a digital sample that represents the modulated out-of-band data.

The object and advantages of the embodiments will be realized and achieved at least by the elements, features, and combinations particularly pointed out in the claims.

It is to be understood that both the foregoing general description and the following detailed description are exemplary and explanatory and are not restrictive of the present disclosure, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein relate to an optical receiver that includes an out-of-band (OOB) signal detector. An optical signal may carry modulated data regarding a communication channel of the optical receiver. In some embodiments, the optical signal may be converted to an electrical signal. The electrical signal may include an alternating current (AC) portion that may include the modulated data. The electrical signal may also include a direct current (DC) portion. A signal power level of the DC portion of an electrical signal may be larger than a power level of the AC portion of an electrical signal.

In some circumstances, the electrical signal may be provided to an analog-to-digital convertor (ADC) circuit to allow for digital demodulation of the electrical signal. In these circumstances, the ADC circuit may receive both the AC portion and the DC portion of the electrical signal. Because the DC portion may be larger than the AC portion, the ADC circuit may have a power level input range that is larger than a power level input range that may be used to accommodate the AC portion that carries the modulated data. In some circumstances, the larger power level input range of the ADC circuit may cause a resolution of the ADC circuit to be diminished.

Some embodiments described in this disclosure relate to an optical receiver that includes an OOB signal detector configured to extract the AC portion of an electrical signal such that the AC portion of the electrical signal and not the DC portion of the electrical signal may be provided to an ADC circuit. In these and other embodiments, a current to voltage processing circuit may extract the AC portion of the electrical signal by creating a voltage differential signal based on the difference in signal power levels between the AC portion and the DC portion of the electrical signal. The extracted AC portion may be amplified by a limiting amplifier circuit configured to center the signal power level of the AC portion within a particular range of the ADC circuit. The ADC circuit may digitally sample the amplified signal and transmit the digital samples to a demodulation circuit configured to extract the data included in the AC portion. The extracted data may be an OOB data and may provide information on an optical signal received by the optical receiver or the communication channel carrying the optical signal.

Embodiments of the present disclosure will be explained with reference to the accompanying drawings.

Figure 1:
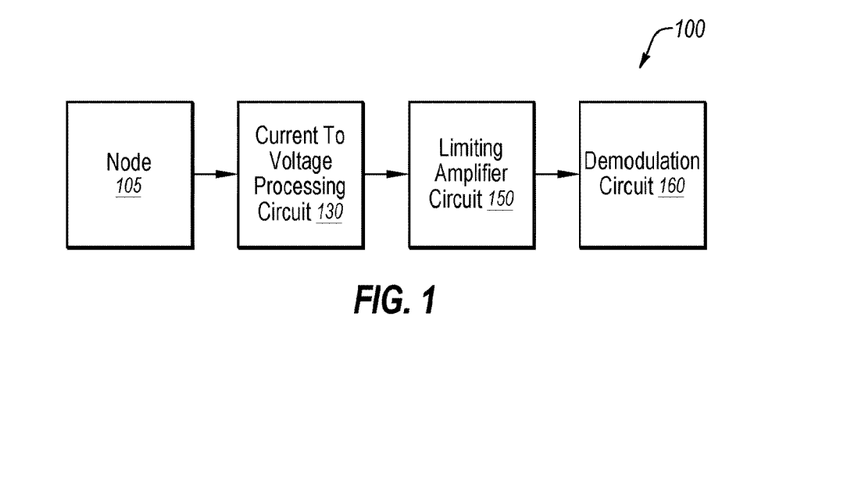
FIG. 1 is a block diagram of an out-of-band signal detection circuit.

FIG. 1 is a block diagram of an out-of-band (OOB) signal detection circuit 100, arranged in accordance with some embodiments described in this disclosure. The OOB signal detection circuit 100 may include, but is not limited to, a node 105, a current to voltage processing circuit 130, a limiting amplifier circuit 150, and a demodulation circuit 160.

An electrical signal may be received by the node 105. The electrical signal may include an electrical in-band signal and an electrical OOB signal. Some examples of data carried by and uses of an in-band signal may include electronic files or programs transmitted over a computer network, command and status signals transmitted between two buildings of a campus or transmitted voice or audio files. The OOB signal may include data relating to management and status of the in-band signal. Alternately or additionally, the OOB signal may include data relating to a condition or status of a communication channel carrying the in-band and OOB signals. For example, the OOB signal may include data indicating an intensity of an optical signal, a command to reduce intensity of an optical signal or a command to increase the intensity of an optical signal.

The in-band signal may be a high speed data signal and the OOB signal may be a low speed data signal. In some embodiments, the in-band signal may result in a high frequency modulated alternating current (AC) portion of the electrical signal. In these and other embodiments, the OOB signal may result in a low frequency modulated AC portion of the electrical signal. The OOB signal detection circuit 100 described in this disclosure may be configured to extract the low frequency modulated AC portion of the electrical signal.

The current to voltage processing circuit 130 may be electrically coupled to the node 105. The current to voltage processing circuit 130 may be configured to receive a DC portion of the electrical signal and the low frequency modulated AC portion of the electrical signal. The current to voltage processing circuit 130 may also be configured to extract the low frequency modulated AC portion of the electrical signal. In some embodiments, the current to voltage processing circuit 130 may extract the low frequency modulated AC portion of the electrical signal by separating the low frequency modulated AC portion from the DC portion, by generating a signal representative of the low frequency modulated AC portion without the DC portion, or by using other extraction methods.

In some embodiments, to extract the low frequency modulated AC portion of the electrical signal, the current to voltage processing circuit 130 may generate a voltage differential signal that is representative of the low frequency modulated AC portion of the electrical signal. In these and other embodiments, the current to voltage processing circuit 130 may include multiple current mirror circuits. The multiple current mirror circuits may be configured to generate the voltage differential signal that is representative of the low frequency modulated AC portion. In these and other embodiments, a first of the multiple current mirror circuits may be configured to pass a first current based on the DC portion of the electrical signal. A second of the multiple current mirror circuits may be configured to pass a second current based on the low frequency modulated AC portion and the DC portion of the electrical signal. The first and second currents may result in first and second voltages in the current to voltage processing circuit 130. The voltage differential signal may be generated based on a difference between the first voltage and the second voltage. The difference between the first voltage and the second voltage may represent the low frequency modulated AC portion of the electrical signal. In this manner, the low frequency modulated AC portion of the electrical signal may be extracted from the electrical signal. The current to voltage processing circuit 130 may provide the voltage differential signal to the limiting amplifier circuit 150.

The limiting amplifier circuit 150 may be electrically coupled to the current to voltage processing circuit 130. The limiting amplifier circuit 150 may be configured to apply a gain to the voltage differential signal and to generate an amplified signal. In some embodiments, the limiting amplifier circuit 150 may generate the amplified signal to be centered within a particular range of signal power levels. In particular, the limiting amplifier circuit 150 may be configured to transmit the amplified signal within a particular signal power level range regardless of the modulation technique used that results in the modulated AC portion of the electrical signal. In some embodiments, providing a signal with signal power within a particular signal power level range may reduce a complexity of other components in the OOB signal detection circuit 100.

The limiting amplifier circuit 150 may transmit the amplified signal to the demodulation circuit 160. The demodulation circuit 160 may be configured to demodulate the amplified signal to extract the data included within the low frequency modulated AC portion of the electrical signal.

Modifications, additions, or omissions may be made to the OOB signal detection circuit 100 without departing from the scope of the present disclosure. For example, in some embodiments, the OOB signal detection circuit 100 may include additional circuits. For example, the OOB signal detection circuit 100 may include one or more of an analog-to-digital converter, a low-pass filter, a stabilizer circuit, among other circuits. As another example, in some embodiments the OOB signal detection circuit 100 may be part of an optical receiver or transceiver.

Figure 2:
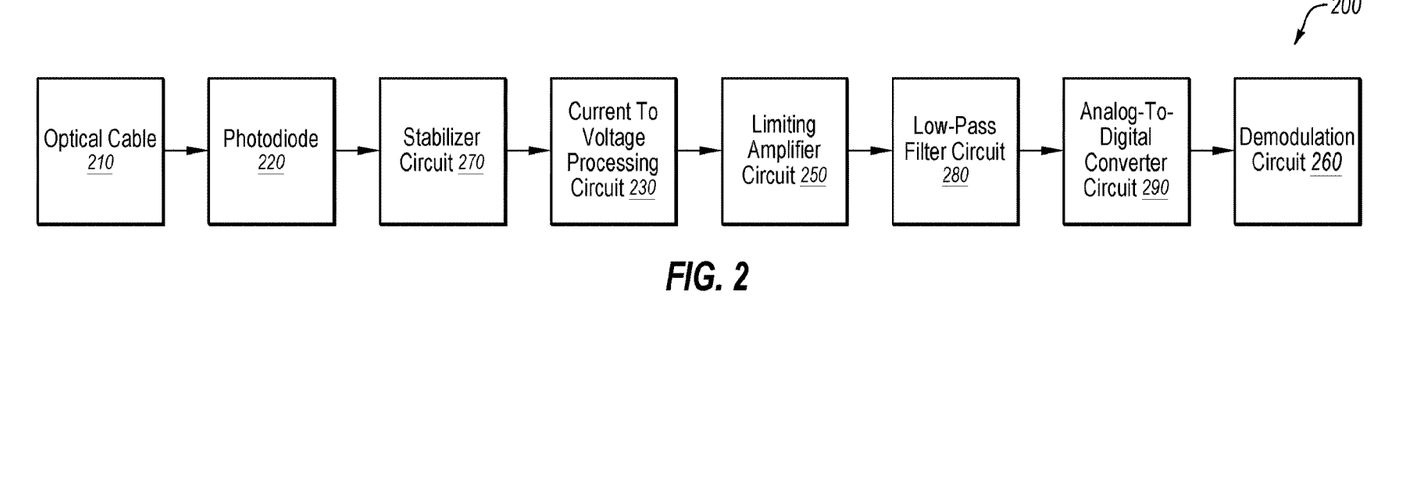
FIG. 2 is a block diagram of another out-of-band signal detection circuit.

FIG. 2 is a block diagram of another out-of-band (OOB) signal detection circuit 200, arranged in accordance with at least some embodiments described in this disclosure. The OOB signal detection circuit 200 may include, but is not limited to, an optical cable 210, a photodiode 220, a stabilizer circuit 270, a current to voltage processing circuit 230, a limiting amplifier circuit 250, a low pass filter circuit 280, an analog-to-digital convertor (ADC) circuit 290, and a demodulation circuit 260.

The optical cable 210 may be configured to carry an optical signal. The optical cable 210 may be a fiber optic cable that includes one or more optical fibers or any other suitable device for carrying optical signals. The optical signal may include an in-band signal and an OOB signal. Some examples of data carried by and uses of an in-band signal may include electronic files or programs transmitted over a computer network, command and status signals transmitted between two buildings of a campus or servers in a server farm, or the transmission of voice or audio files. The OOB signal may include data related to the management and status of the optical signal and/or the optical channel that carries the optical signal. For example, the OOB signal may include data indicating an intensity of the optical signal, a command to reduce intensity of the optical signal, and/or a command to increase the intensity of an optical signal.

The optical cable 210 may be optically coupled to the photodiode 220. The photodiode 220 may be configured to receive the optical signal and to generate an electrical signal based on the received optical signal.

In some embodiments, the optical signal may be modulated at both a high frequency and a low frequency. The high frequency modulation may carry in-band data by way of the in-band signal. In some embodiments, the high frequency modulation may be a first intensity modulation. The low frequency modulation may carry OOB data by way of the OOB signal. In some embodiments, the low frequency modulation may be a second intensity modulation that is smaller than the first intensity modulation. In these and other embodiments, the low frequency modulation may ride on top of the high frequency modulation.

In these and other embodiments, when the optical signal is converted to an electrical signal, the high speed signals may be converted to a high speed current signal and provided to another circuit for demodulation to extract the in-band signals from the optical signal. The photodiode 220 may further generate an electrical signal that includes a DC portion and a low frequency modulated AC portion. The low frequency modulated AC portion may be the second intensity modulations for the OOB data. The photodiode 220 may provide the electrical signal, with the DC portion and the low frequency modulated AC portion, to the stabilizer circuit 270.

The stabilizer circuit 270 may be electrically coupled to the photodiode 220. The stabilizer circuit 270 may be configured to stabilize a voltage on the photodiode 220 at a particular level. The stabilizer circuit 270 may provide the electrical signal to the current to voltage processing circuit 230.

The current to voltage processing circuit 230 may be electrically coupled to the stabilizer circuit 270. The current to voltage processing circuit 230 may be configured to receive the electrical signal. The current to voltage processing circuit 230 may also be configured to extract the low frequency modulated AC portion of the electrical signal. In some embodiments, the current to voltage processing circuit 230 may extract the low frequency modulated AC portion by generating a signal representative of the low frequency modulated AC portion without the DC portion of the electrical signal.

In some embodiments, the current to voltage processing circuit 230 may generate a voltage differential signal that is representative of the low frequency modulated AC portion of the electrical signal. In these and other embodiments, the current to voltage processing circuit 230 may include multiple current mirror circuits. The multiple current mirror circuits may be configured to generate the voltage differential signal that is representative of the low frequency modulated AC portion of the electrical signal. In these and other embodiments, a first of the multiple current mirror circuits may be configured to pass a first current based on the DC portion of the electrical signal. A second of the current mirror circuits may be configured to pass a second current based on the DC portion and the low frequency modulated AC portion of the electrical signal. The first and second currents may result in first and second voltages in the current to voltage processing circuit 230. The voltage differential signal may be generated based on a difference between the first voltage and the second voltage. The difference between the first voltage and the second voltage may represent the low frequency modulated AC portion of the electrical signal. The current to voltage processing circuit 230 may provide the voltage differential signal to the limiting amplifier circuit 250.

The limiting amplifier circuit 250 may be electrically coupled to the current to voltage processing circuit 230. The limiting amplifier circuit 250 may be configured to apply a gain to the voltage differential signal to generate an amplified signal. In some embodiments, the amplified signal may have a power level that is limited to a particular power level range regardless of the input power level. In these and other embodiments, the gain may thus be greater than one, one, or less than one.

The low pass filter circuit 280 may be electrically coupled to the limiting amplifier circuit 250. The low pass filter circuit 280 may be configured to receive the amplified signal. The low pass filter circuit 280 may also be configured to pass a filtered signal by blocking particular features of the amplified signal. For example, the low pass filter circuit 280 may block a portion of the amplified signal above a low frequency threshold frequency. The low pass filter circuit 280 may be configured to pass the filtered signal to the ADC circuit 290.

The ADC circuit 290 may be configured to receive the filtered signal. The ADC circuit 290 may convert the filtered signal into one or more digital samples with digital values. In some embodiments, the ADC circuit 290 may periodically sample the voltage of the filtered signal and may create a digital sample based on the filtered signal. The ADC circuit 290 may have a particular range of signal power levels that may be processed. In these and other embodiments, the limiting amplifier circuit 250 may generate the amplified signal with a power level within the range of signal power levels that may be processed by the ADC circuit 290.

The ADC circuit 290 may transmit the digital samples to the demodulation circuit 260. The demodulation circuit 260 may be configured to demodulate the digital samples to extract the OOB data included within the low frequency modulated AC portion of the electrical signal.

Modifications, additions, or omissions may be made to the OOB signal detection circuit 200 without departing from the scope of the present disclosure. For example, in some embodiments, the OOB signal detection circuit 200 may include fewer circuits. For example, the OOB signal detection circuit 200 may not include one or more of a low pass filter circuit 280, a stabilizer circuit 270, among other circuits. As another example, in some embodiments the OOB signal detection circuit 200 may be part of an optical receiver or transceiver.

Figure 3:
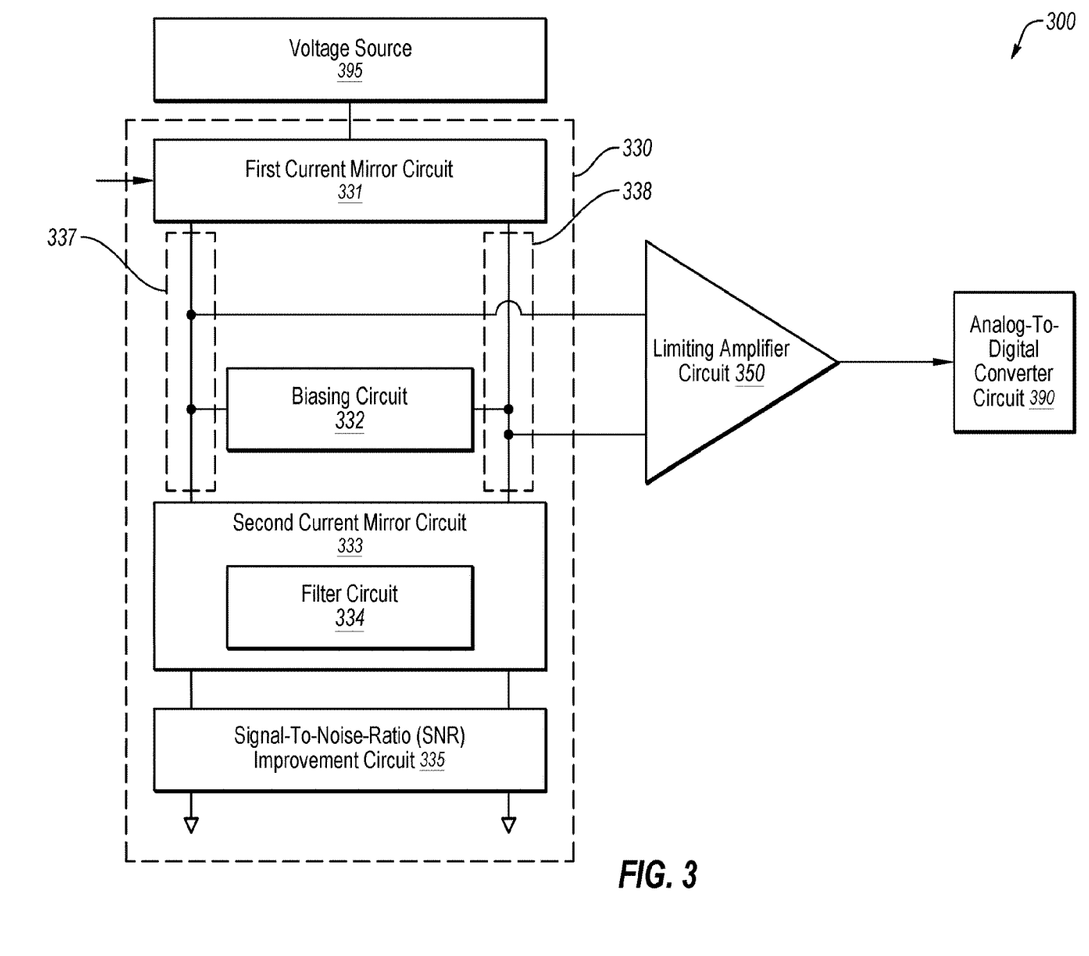
FIG. 3 is a block diagram of yet another out-of-band signal detection circuit.

FIG. 3 is block diagram of yet another out-of-band (OOB) signal detection circuit 300, arranged in accordance with at least some embodiments described in this disclosure. The OOB signal detection circuit 300 may include, but is not limited to, a current to voltage processing circuit 330, a voltage source 395, a limiting amplifier circuit 350, and an analog-to-digital convertor (ADC) circuit 390.

The current to voltage processing circuit 330 may include, but is not limited to, a first current mirror circuit 331, a biasing circuit 332, a second current mirror circuit 333, a first connection 337, a second connection 338, and a signal-to-noise ratio (SNR) improvement circuit 335.

The current to voltage processing circuit 330 may be configured to receive an OOB signal. The OOB signal may be an electrical signal and may include a DC portion and a modulated AC portion. In some embodiments, the electrical signal may be derived from an optical signal.

The electrical signal may be received by the first current mirror circuit 331. The first current mirror circuit 331 may pass a first current to the second current mirror circuit 333 along both the first connection 337 and the second connection 338. The first current may be based on the DC portion and the modulated AC portion of the electrical signal. The voltage source 395 may provide a positive voltage to the first current mirror circuit 331. The positive voltage may cause the first current mirror circuit 331 to pass the first current to the second current mirror circuit 333. The first current may pass from the voltage source 395 to a signal ground through the second current mirror circuit 333 and the SNR improvement circuit 335.

The second current mirror circuit 333 may be electrically coupled to the first current mirror circuit 331 by way of the first connection 337 and the second connection 338. The second current mirror circuit 333 may be configured to receive the first current on the first connection 337. The second current mirror circuit 333 may include a filter circuit 334 electrically coupled to the first connection 337 and configured to extract the modulated AC portion of the electrical signal. The remaining DC portion of the electrical signal may be used to control the current passed by the second current mirror circuit 333 that is received from the second connection 338. Thus, in these and other embodiments, the second current mirror circuit 333 may pass a second current from the second connection 338 based on the DC portion of the electrical signal and not based on the modulated AC portion of the electrical signal. Furthermore, the second current mirror circuit 333 may pass the first current from the first connection 337 based on the DC portion of the electrical signal and on the modulated AC portion of the electrical signal. Because the currents passed by the second current mirror circuit 333 are different, each of the first connection 337 and the second connection 338 may have a different voltage. The different voltages may be used to generate a voltage differential signal that may be provided to the limiting amplifier circuit 350.

Thus, in some embodiments, the current to voltage processing circuit 330 may be configured to extract the modulated AC portion by generating a voltage differential signal representative of the modulated AC portion without the DC portion and passing the voltage differential signal to the limiting amplifier circuit 350.

The biasing circuit 332 may be electrically coupled between the first connection 337 and the second connection 338. The biasing circuit 332 may be configured to control a voltage and/or a current in the first current mirror circuit 331 and the second current mirror circuit 333. Controlling the voltage and/or current of the first current mirror circuit 331 and the second current mirror circuit 333 may increase the likelihood that the first current mirror circuit 331 and the second current mirror circuit 333 operate in a particular region of operation. For example, the first current mirror circuit 331 and the second current mirror circuit 333 may include multiple transistors. The particular region of operation may be a triode or a saturation region of the multiple transistors. In some embodiments, a transistor may pass a constant current when operating in the saturation region of an operational curve. In these and other embodiments, a transistor may pass a varying current when operating in the triode region of an operational curve.

The SNR improvement circuit 335 may be electrically coupled between the second current mirror circuit 333 and a signal ground. The SNR improvement circuit 335 may be configured to reduce noise in the second current mirror circuit 333.

The limiting amplifier circuit 350 may be electrically coupled to the first current mirror circuit 331, the second current mirror circuit 333, and the biasing circuit 332. The limiting amplifier circuit 350 may be configured to receive the voltage differential signal and apply a gain to the voltage differential signal to generate an amplified signal. In some embodiments, the amplified signal may have a power level that is limited to a particular range regardless of the input power level.

The ADC circuit 390 may be electrically coupled to the limiting amplifier circuit 350. The ADC circuit 390 may be configured to receive the amplified signal. The ADC circuit 390 may convert the amplified signal into one or more digital samples with digital values. In some embodiments, the ADC circuit 390 may periodically sample, randomly sample, or otherwise sample the voltage of the amplified signal and create a digital sample based on the amplified signal. The ADC circuit 390 may have a particular range of signal power levels that may be processed. In these and other embodiments, the limiting amplifier circuit 350 may generate the amplified signal with a power level within the range of signal power levels that may be processed by the ADC circuit 390.

Modifications, additions, or omissions may be made to the OOB signal detection circuit 300 without departing from the scope of the present disclosure. For example, in some embodiments the OOB signal detection circuit 300 may be part of an optical receiver or transceiver. As another example, in some embodiments, the OOB signal detection circuit 300 may include fewer circuits. For example, the OOB signal detection circuit 300 may not include the SNR improvement circuit 335.

Figure 4:
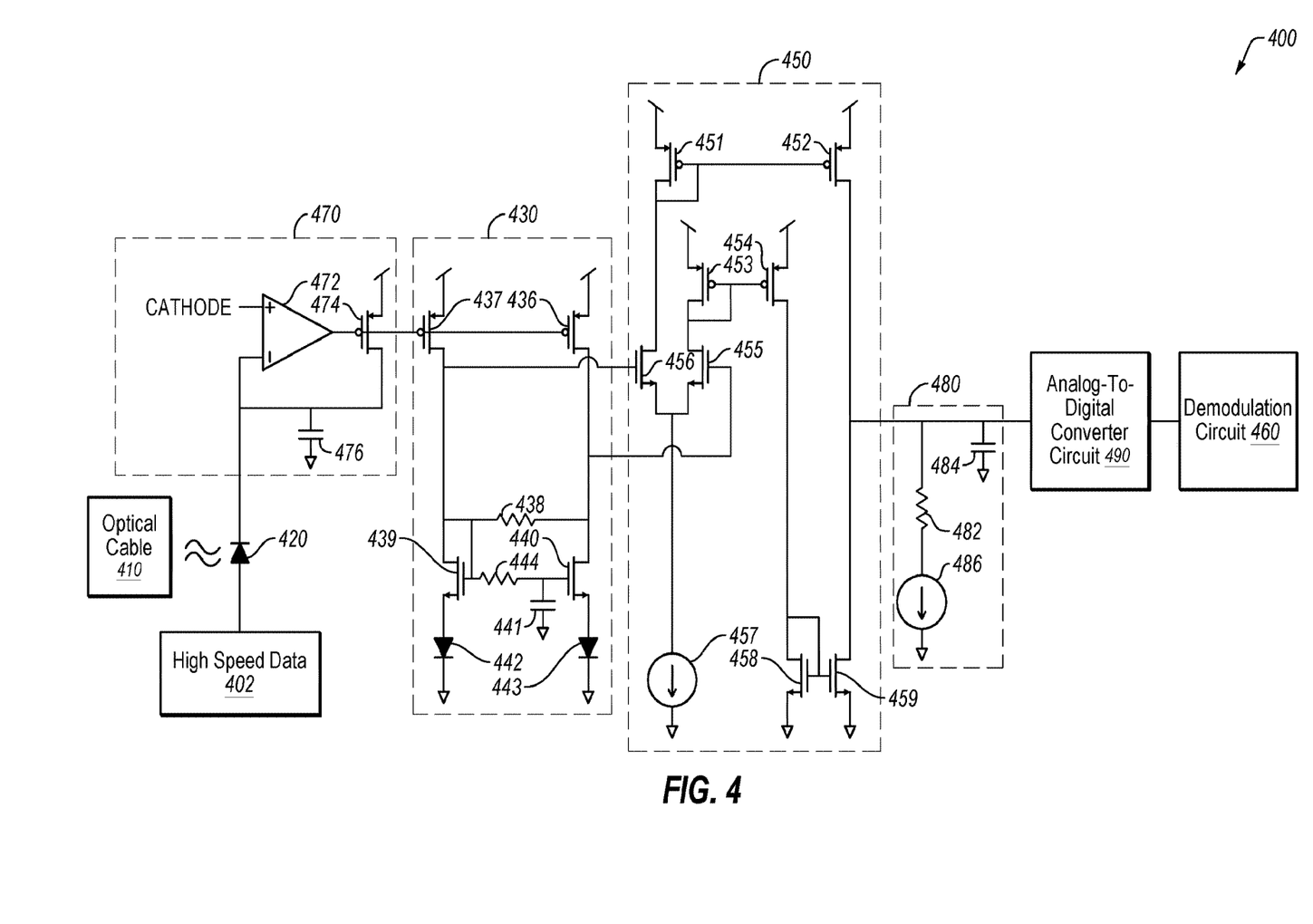
FIG. 4 is a circuit diagram of an out-of-band signal detection circuit.

FIG. 4 is a circuit drawing of an out-of-band (OOB) signal detection circuit 400, arranged in accordance with at least some embodiments described in this disclosure. The OOB signal detection circuit 400 may include, but is not limited to, an optical cable 410, a photodiode 420, a stabilizer circuit 470, a current to voltage processing circuit 430, a limiting amplifier circuit 450, a low pass filter circuit 480, an analog-to-digital convertor (ADC) circuit 490, and a demodulation circuit 460.

The optical cable 410 may be configured to carry an optical signal that may include an optical in-band signal and an optical OOB signal. The optical cable 410 may be optically coupled to the photodiode 420. The photodiode 420 may be configured to receive the optical signal and to generate an electrical signal that includes a DC portion and a modulated AC portion and may be based on the received optical signal. The photodiode 420 may provide the electrical signal including the DC portion and the modulated AC portion to the stabilizer circuit 470.

In these and other embodiments, when the optical signal is converted to an electrical signal, the high speed signals may be converted to a high speed data 402 and provided to another circuit for demodulation to extract the in-band signals from the optical signal.

The stabilizer circuit 470 may include an operational amplifier 472, a first transistor 474, and a first capacitive circuit 476. The first transistor may include a gate, a source, and a drain. Generally, with respect to the transistors illustrated in FIG. 4, a transistor source may be a terminal with an arrow, a transistor gate may be a terminal with parallel horizontal lines, and a transistor drain may be the other terminal.

The operational amplifier 472 may have a positive input electrically coupled to a cathode of the photodiode 420, the first capacitive circuit 476, and the drain of the first transistor 474. The operational amplifier 472 may have a voltage provided on a negative input. The first capacitive circuit 476 may be coupled between a signal ground and the cathode of the photodiode 420, the drain of the first transistor 474, and the positive input of the operational amplifier 472. The gate of the first transistor 474 may be electrically coupled to an output of the operational amplifier 472. The drain of the first transistor 474 may be electrically coupled to the positive input of the operational amplifier 472, the first capacitive circuit 476, and the cathode of the photodiode 420. The source of the first transistor 474 may be electrically coupled to a voltage source. The stabilizer circuit 470 may be configured to stabilize a voltage on the photodiode 420 at a particular level. The stabilizer circuit 470 may provide a stabilized signal to the current to voltage processing circuit 430 based on the stabilized voltage on the photodiode 420.

The current to voltage processing circuit 430 may include a second transistor 437, a third transistor 436, a first resistive circuit 438, a fourth transistor 439, a second capacitive circuit 441, a second resistive circuit 444, a first diode 442, a second diode 443, and a fifth transistor 440. Each of the transistors 436, 437, 439, and 440 may include a gate, a source, and a drain.

The gate of the second transistor 437 may be electrically coupled to the gate of the first transistor 474 and the gate of the third transistor 436. The second transistor 437 may be configured to receive the stabilized signal from the stabilizer circuit 470. The source of the second transistor 437 may be electrically coupled to a voltage source. The drain of the second transistor 437 may be electrically coupled to the first resistive circuit 438, the second resistive circuit 444, the drain and gate of the fourth transistor 439, and the limiting amplifier circuit 450.

The gate of the third transistor 436 may be electrically coupled to the gate of the second transistor 437 and the stabilizer circuit 470. The source of the third transistor 436 may be electrically coupled to a voltage source. The drain of the third transistor 436 may be electrically coupled to the first resistive circuit 438, the drain of the fifth transistor 440, and the limiting amplifier circuit 450.

The drain of the fourth transistor 439 may be electrically coupled to the drain of the second transistor 437, the first resistive circuit 438, the second resistive circuit 444, the gate of the fourth transistor 439, and the limiting amplifier circuit 450. The gate of the fourth transistor 439 may be electrically coupled to the first resistive circuit 438, the second resistive circuit 444, the drain of the second transistor 437, and the drain of the fourth transistor 439. The source of the fourth transistor 439 may be electrically coupled to an anode of the first diode 442.

The drain of the fifth transistor 440 may be electrically coupled to the first resistive circuit 438, the drain of the third transistor 436, and the limiting amplifier circuit 450. The gate of the fifth transistor 440 may be electrically coupled to the second resistive circuit 444 and the second capacitive circuit 441. The source of the fifth transistor 440 may be electrically coupled to an anode of the second diode 443.

A first end of the first resistive circuit 438 may be electrically coupled to the drain and gate of the fourth transistor 439, the drain of the second transistor 437, and the second resistive circuit 444. A second end of the first resistive circuit 438 may be electrically coupled to the drain of the third transistor 436, the drain of the fifth transistor 440, and the limiting amplifier circuit 450.

A first end of the second resistive circuit 444 may be electrically coupled to the gate and drain of the fourth transistor 439, the drain of the second transistor 437, the first resistive circuit 438, and the limiting amplifier circuit 450. A second end of the second resistive circuit 444 may be electrically coupled to the second capacitive circuit 441 and the gate of the fifth transistor 440.

The second capacitive circuit 441 may be electrically coupled between a signal ground and the second resistive circuit 444 and the gate of the fifth transistor 440. The first diode 442 may be electrically coupled between the source of the fourth transistor 439 and a signal ground. The second diode 443 may be electrically coupled between the source of the fifth transistor 440 and a signal ground. The current to voltage processing circuit 430 may be configured to extract the modulated AC portion of the electrical signal and provide the modulated AC portion to the limiting amplifier circuit 450.

The first transistor 474 may provide a voltage to the gate of the second transistor 437 and the gate of the third transistor 436. The voltage may be based on the DC portion and the modulated AC portion of the electrical signal. The voltage on the gate of the second transistor 437 and the gate of the third transistor 436 may cause the second transistor 437 to pass the first current to the fourth transistor 439 and the third transistor 436 to pass the first current. A voltage on the drain of the second transistor 437 may be provided to the limiting amplifier circuit 450. The voltage on the drain of the second transistor 437 may be based on the DC portion and the modulated AC portion of the electrical and may be part of the voltage differential signal.

The voltage on the drain of the second transistor 437 may be provided to the gate of the fourth transistor 439. The voltage on the gate of the fourth transistor 439 may be based on the DC portion and the modulated AC portion of the electrical signal and may cause the fourth transistor 439 to pass the first current. The second resistive circuit 444 and the second capacitive circuit 441 may average the voltage on the gate of the fourth transistor 439 and may provide a voltage to the gate of the fifth transistor 440 based on the DC portion of the electrical signal. The voltage on the gate of the fifth transistor 440 may cause the fifth transistor 440 to pass a second current that is different than the first current passed by the third transistor 436. As a result, a voltage on the drain of the fifth transistor 440 may be different than the voltage on the drain of the second transistor 437. The voltage on the drain of the fifth transistor 440 may be provided to the limiting amplifier circuit 450. The voltage on the drain of the fifth transistor may be based on the DC portion of the electrical signal and not based on the modulated AC portion and may form the other part of the voltage differential signal.

The limiting amplifier circuit 450 may be configured to receive the voltage differential signal and to generate an amplified signal based on the voltage differential signal. The limiting amplifier circuit 450 may include, but is not limited to, a sixth transistor 451, a seventh transistor 452, an eighth transistor 453, a ninth transistor 454, a tenth transistor 455, an eleventh transistor 456, a twelfth transistor 458, a thirteenth transistor 459, and a current source 457. Each of the transistors 451, 452, 453, 454, 455, 456, 458, and 459 may include a gate, a source, and a drain.

The gate of the eleventh transistor 456 may be electrically coupled to the drain of the second transistor 437, the first resistive circuit 438, the gate and drain of the fourth transistor 439 and the second resistive circuit 444. The drain of the eleventh transistor 456 may be electrically coupled to the drain and gate of the sixth transistor 451, and the gate of the seventh transistor 452. The source of the eleventh transistor 456 may be electrically coupled to the source of the tenth transistor 455 and the current source 457.

The gate of the tenth transistor 455 may be electrically coupled to the drain of the third transistor 436, the drain of the fifth transistor 440, and the first resistive circuit 438. The drain of the tenth transistor 455 may be electrically coupled to the drain and gate of the eighth transistor 453 and the gate of the ninth transistor 454. The source of the tenth transistor 455 may be electrically coupled to the source of the eleventh transistor 456 and the current source 457.

The gate of the sixth transistor 451 may be electrically coupled to the gate of the seventh transistor 452, the drain of the eleventh transistor 456, and the drain of the sixth transistor 451. The source of the sixth transistor 451 may be electrically coupled to a voltage source. The drain of the sixth transistor 451 may be electrically coupled to the gate of the seventh transistor 452, the gate of the sixth transistor 451, and the drain of the eleventh transistor 456.

The gate of the seventh transistor 452 may be electrically coupled to the gate and drain of the sixth transistor 451 and the drain of the eleventh transistor 456. The source of the seventh transistor 452 may be electrically coupled to a voltage source. The drain of the seventh transistor 452 may be electrically coupled to the drain of the thirteenth transistor 459 and the low pass filter circuit 480.

The gate of the eighth transistor 453 may be electrically coupled to the gate of the ninth transistor 454, the drain of the eighth transistor 453, and the drain of the tenth transistor 455. The source of the eighth transistor 453 may be electrically coupled to a voltage source. The drain of the eighth transistor 453 may be electrically coupled to the drain of the tenth transistor 455, the gate of the eighth transistor 453, and the gate of the ninth transistor 454.

The gate of the ninth transistor 454 may be electrically coupled to the gate and drain of the eighth transistor 453 and the drain of the tenth transistor 455. The source of the ninth transistor 454 may be electrically coupled to a voltage source. The drain of the ninth transistor 454 may be electrically coupled to the gate and drain of the twelfth transistor 458 and the gate of the thirteenth transistor 459.

The gate of the twelfth transistor 458 may be electrically coupled to the gate of the thirteenth transistor 459, the drain of the twelfth transistor 458, and the drain of the ninth transistor 454. The source of the twelfth transistor 458 may be electrically coupled to a signal ground. The drain of the twelfth transistor 458 may be electrically coupled to the gate of the thirteenth transistor 459, the gate of the twelfth transistor 458, and the drain of the ninth transistor 454.

The gate of the thirteenth transistor 459 may be electrically coupled to the gate and drain of the twelfth transistor 458 and the drain of the ninth transistor 454. The source of the thirteenth transistor 459 may be electrically coupled to a signal ground. The drain of the thirteenth transistor 459 may be electrically coupled to the drain of the seventh transistor 452 and the low pass filter circuit 480. The current source 457 may be electrically coupled between a signal ground, the source of the tenth transistor 455, and the source of the eleventh transistor 456.

The low pass filter circuit 480 may be configured to receive the amplified signal from the limiting amplifier circuit 450. The low pass filter circuit 480 may be configured to block particular features of the amplified signal and to pass a filtered signal to the ADC circuit 490. The low pass filter circuit 480 may include, but is not limited to, a third resistive circuit 482, a voltage source 486, and second capacitive circuit 484. The voltage source 486 may include a positive source and a negative source.

The third resistive circuit 482 may be electrically coupled to the positive source of the voltage source 486, the second capacitive circuit 484, the limiting amplifier circuit 450, and the ADC circuit 490. The second capacitive circuit 484 may be electrically coupled between a signal ground and the limiting amplifier circuit 450, the third resistive circuit 482, and the ADC circuit 490. The voltage source 486 may be coupled between a signal ground and the third resistive circuit 482.

The ADC circuit 490 may be electrically coupled to the low pass filter circuit 480. The ADC circuit 490 may be configured to receive the filtered signal. The ADC circuit 490 may convert the filtered signal into one or more digital samples with digital values.

The ADC circuit 490 may transmit the digital samples to the demodulation circuit 460. The demodulation circuit 460 may be configured to demodulate the digital samples to extract the data included within the modulated AC portion of the electrical signal.

Modifications, additions, or omissions may be made to the OOB signal detection circuit 400 without departing from the scope of the present disclosure. For example, in some embodiments, the OOB signal detection circuit 400 may include fewer circuits. For example, the OOB signal detection circuit 400 may not include one or more of the low pass filter circuit 480 and the stabilizer circuit 470, among other circuits. As another example, in some embodiments the OOB signal detection circuit 400 may be part of an optical receiver or transceiver.

Figure 5:
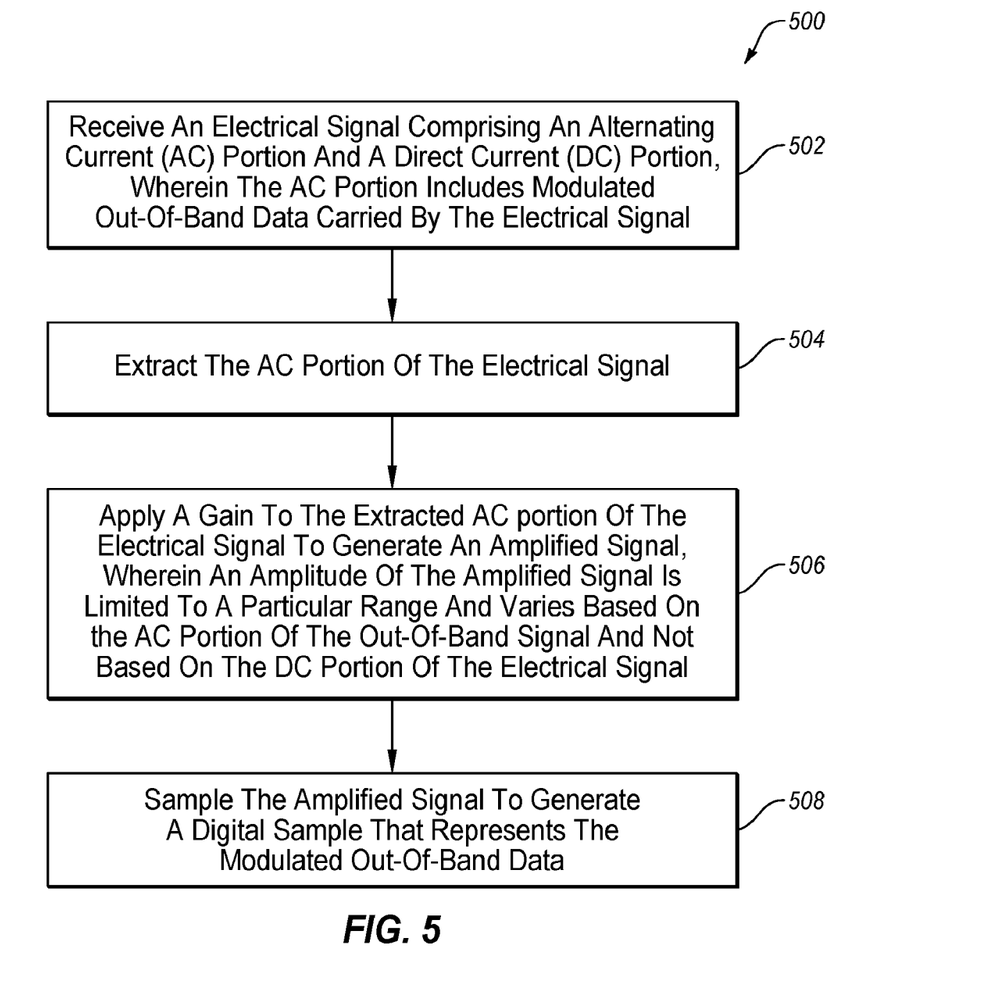
FIG. 5 is a flowchart of an example method of out-of-band signal detection.

FIG. 5 is a flowchart of an example method 500 of out-of-band (OOB) signal detection, in accordance with at least some embodiments described herein. The method 500 may be implemented, in some embodiments, by an OOB detection circuit, such as the OOB signal detection circuits 100, 200, 300, and/or 400 of FIG. 1, 2, 3, or 4 respectively. Although illustrated as discrete blocks, various blocks may be divided into additional blocks, combined into fewer blocks, or eliminated, depending on the desired implementation.

The method 500 may begin at block 502 where an electrical signal including an alternating current (AC) portion and a direct current (DC) portion may be received. The AC portion may include modulated OOB data carried by the electrical signal.

In block 504, the modulated AC portion of the electrical signal may be extracted. In some embodiments, extracting the modulated AC portion of the electrical signal may include averaging a voltage based on a current that includes the modulated OOB data carried by the electrical signal. Alternately or additionally, extracting the modulated AC portion of the electrical signal may also include extracting a difference between the average voltage and a voltage of the electrical signal.

In block 506, a gain may be applied to the extracted modulated AC portion of the electrical signal to generate an amplified signal. An amplitude of the amplified signal may be limited to a particular range and may vary based on the modulated AC portion of the electrical signal and not based on the DC portion of the electrical signal. In some embodiments, the particular range that the amplitude of the amplified signal is limited to may be based on a power range that may be received by an analog-to-digital convertor. In block 508, the amplified signal may be sampled to generate a digital sample that represents the modulated OOB data.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For instance, the method 500 may further include generating the electrical signal based on an optical signal.

Figure 6:
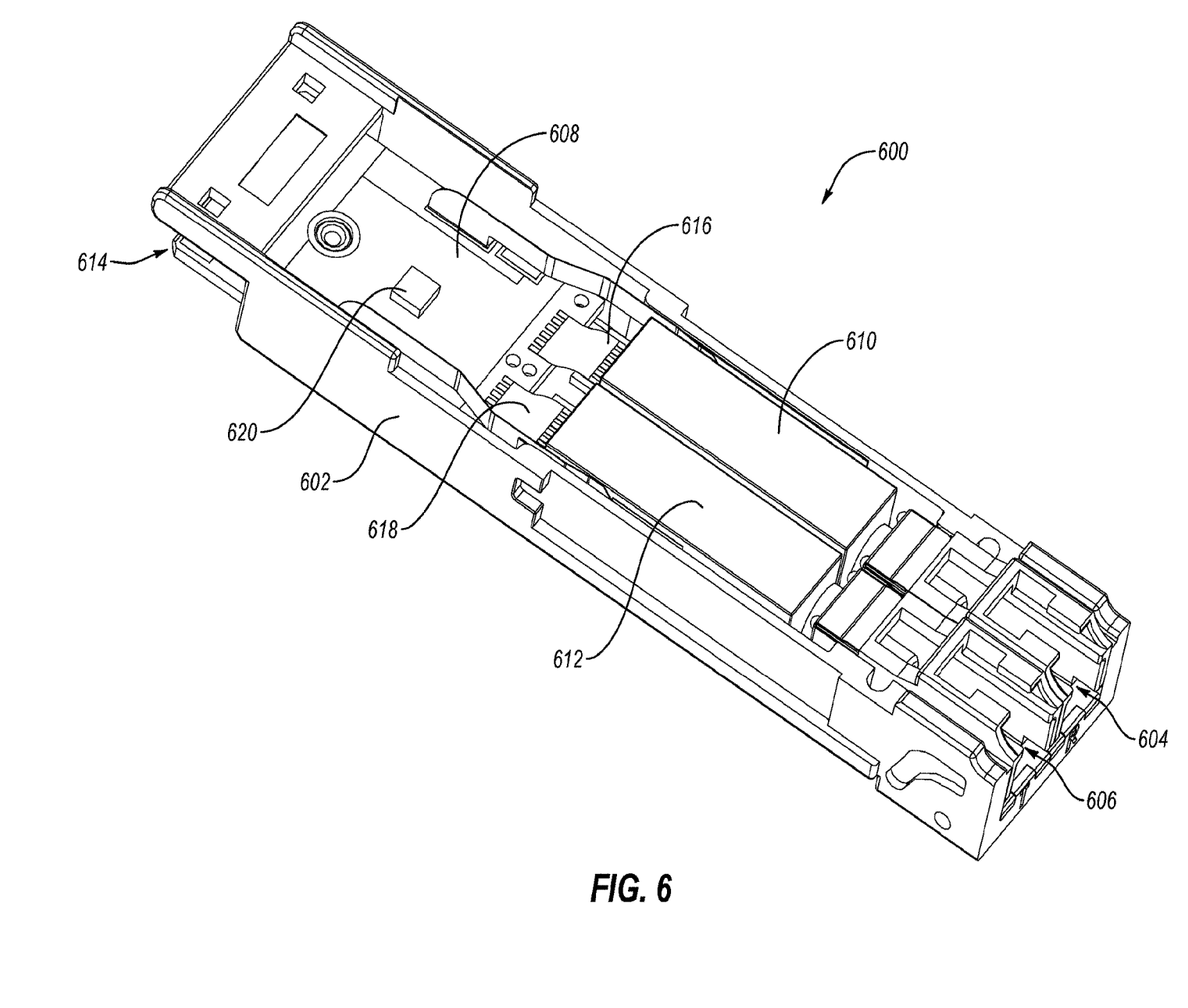
FIG. 6 is a perspective view of an example optoelectronic module where a signal may be converted.

FIG. 6 is a perspective view of an example optoelectronic module 600 (hereinafter "module 600") that may include an out-of-band (OOB) signal detection circuit 620, arranged in accordance with at least some embodiments described herein. The module 600 may be configured for use in transmitting and receiving optical signals in connection with a host device (not shown).

As illustrated, the module 600 may include, but is not limited to, a bottom housing 602, a receive port 604, and a transmit port 606, both defined in the bottom housing 602; a PCB 608 positioned within the bottom housing 602, the PCB 608 having the OOB signal detection circuit 620 positioned thereon; and a receiver optical subassembly (ROSA) 610 and a transmitter optical subassembly (TOSA) 612 also positioned within the bottom housing 602. An edge connector 614 may be located on an end of the PCB 608 to enable the module 600 to electrically interface with the host device. As such, the PCB 608 facilitates electrical communication between the host device and the ROSA 610 and the TOSA 612.

The module 600 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 600 may be configured for optical signal transmission and reception at various distinct wavelengths using wavelength division multiplexing (WDM) using one of various WDM schemes, such as Coarse WDM, Dense WDM, or Light WDM.

Furthermore, the module 600 may be configured to support various communication protocols including, but not limited to, Fibre Channel and High Speed Ethernet. In addition, although illustrated in a particular form factor in FIG. 6, more generally, the module 600 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 610 may house one or more optical receivers, such as photodiodes, that are electrically coupled to an electrical interface 616. The one or more optical receivers may be configured to convert optical signals received through the receive port 604 into corresponding electrical signals that are relayed to the host device through the electrical interface 616 and the PCB 608. In some embodiments, the ROSA 610 may receive an optical signal. In these and other embodiments, the ROSA may convert the optical signal to an electrical signal that includes a direct current (DC) portion and a modulated alternating current (AC) portion. The AC portion may include modulated OOB data carried by the electrical signal. The modulated AC portion of the electrical signal may be extracted using an OOB signal detection circuit 620, such as one of the OOB signal detection circuits 100, 200, 300, or 400 of FIGS. 1, 2, 3, and 4. The extracted modulated AC portion may be demodulated to capture OOB data regarding the optical signal and/or the optical channel that carries the optical signal.

The TOSA 612 may house one or more optical transmitters, such as lasers, that are electrically coupled to another electrical interface 618. The one or more optical transmitters may be configured to convert electrical signals received from the host device by way of the PCB 608 and the electrical interface 618 into corresponding optical signals that are transmitted through the transmit port 606.

The module 600 illustrated with respect to FIG. 6 is one architecture in which embodiments of the present disclosure may be employed. It should be understood that this specific architecture is only one of countless architectures in which embodiments may be employed. The scope of the present disclosure is not intended to be limited to any particular architecture or environment.

In some embodiments, an optical receiver that includes an out-of-band signal detector is disclosed. In these and other embodiments, the optical receiver may include a photodiode including an anode and a cathode. The photodiode may be configured to receive an optical in-band signal and an optical out-of-band signal from an optical cable and to generate an electrical signal based on the optical out-of-band signal. The optical receiver may include a current to voltage processing circuit that includes multiple current mirror circuits. The current to voltage processing circuit may be electrically coupled to the cathode and configured to extract a modulated out-of-band data signal from the electrical signal.

The optical receiver may further include a limiting amplifier circuit electrically coupled to the plurality of current mirror circuits and configured to receive the extracted modulated out-of-band data signal and to apply a gain to the extracted modulated out-of-band data signal to generate an amplified signal. The optical receiver may further include a demodulation circuit electrically coupled to the limiting amplifier circuit and configured to demodulate the modulated out-of-band data signal included in the amplified signal.

In some embodiments, the multiple current mirror circuits may include a first current mirror circuit with first and second transistors and a second current mirror circuit with third and fourth transistors. The gates of the first and second transistors may be electrically coupled to the cathode and drains of the first, second, third and fourth transistors are electrically coupled to the limiting amplifier circuit.

In some embodiments, the optical receiver may further include a biasing circuit electrically coupled between the drain of the fourth transistor and a gate and the drain of the third transistor. The biasing circuit may be configured to control a voltage and/or a current in the plurality of current mirror circuits. In these and other embodiments, the electrical signal may further include a direct current portion. In some embodiments, the current to voltage processing circuit may further include a filter circuit electrically coupled to the fourth transistor and the gate and the drain of the third transistor, the filter circuit being configured to extract the modulated out-of-band data signal.

In some embodiments, the optical receiver may further include a signal-to-noise-ratio (SNR) improvement circuit electrically coupled to the second current mirror circuit. In these and other embodiments, the SNR improvement circuit may be configured to increase a dynamic direct current input range of the optical receiver. In some embodiments, the SNR improvement circuit may include a first diode and a second diode. In these and other embodiments, the first diode is electrically coupled between a source of the third transistor and a signal ground and the second diode is electrically coupled between a source of the fourth transistor and the signal ground.

In some embodiments, the optical receiver may further include a first node electrically coupled to the drains of the first and third transistors, a gate of the third transistor, and the limiting amplifier circuit, a second node electrically coupled to the drains of the second and third transistors and the limiting amplifier circuit, a first resistive circuit electrically coupled between the first node and the second node, a second resistive circuit electrically coupled between the first node and a gate of the fourth transistor, and a capacitive circuit electrically coupled between the gate of the fourth transistor and a signal ground.

In some embodiments, the optical receiver may further include a stabilizer circuit electrically coupled between the cathode and the plurality of current mirror circuits. In these and other embodiments, the stabilizer circuit may be configured to stabilize a voltage on the cathode. In some embodiments, the optical receiver may further include an analog-to-digital convertor electrically coupled between the limiting amplifier circuit and the demodulation circuit. In these and other embodiments, the analog-to-digital convertor may be configured to sample the amplified signal.

In some embodiments, an out-of-band signal detector may include a first node configured to receive an alternating current (AC) portion and a direct current (DC) portion of an electrical signal. In these and other embodiments, the AC portion may include modulated out-of-band data carried by the electrical signal. The out-of-band signal detector may further include a current to voltage processing circuit electrically coupled to the first node and configured to extract the AC portion of the electrical signal, a limiting amplifier circuit electrically coupled to the current to voltage processing circuit and configured to receive the extracted AC portion and to generate an amplified signal based on the extracted AC portion, and an analog-to-digital convertor circuit electrically coupled to the limiting amplifier circuit and configured to sample the amplified signal and to generate a digital sample that represents the modulated out-of-band data.

The out-of-band signal detector may further include a digital demodulation circuit electrically coupled to the analog-to-digital convertor circuit. In these and other embodiments, the digital demodulation circuit may be configured to demodulate the modulated out-of-band data included in the amplified signal. In some embodiments, the limiting amplifier circuit may generate the amplified signal to be within a power range that can be received by the analog-to-digital convertor circuit.

The out-of-band signal detector may further include a biasing circuit configured to control a voltage and/or current in multiple current mirror circuits. In these and other embodiments, the multiple current mirror circuits may include a first current mirror circuit with first and second transistors and a second current mirror circuit with third and fourth transistors. In these and other embodiments, gates of the first and second transistors may be electrically coupled to the first node and drains of the first, second, third and fourth transistors are electrically coupled to the limiting amplifier circuit.

The out-of-band signal detector may further include a first node electrically coupled to the drains of the first and third transistors, a gate of the third transistor, and the limiting amplifier circuit, a second node electrically coupled to the drains of the second and third transistors and the limiting amplifier circuit, a first resistive circuit electrically coupled between the first node and the second node, a second resistive circuit electrically coupled between the first node and a gate of the fourth transistor, and a capacitive circuit electrically coupled between the gate of the fourth transistor and a signal ground.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. An optical receiver comprising:
   a photodiode configured to generate an electrical signal based on a received optical out-of-band signal;
   a plurality of current mirror circuits configured to extract a voltage differential signal that represents a modulated out-of-band data signal based on the electrical signal;
   a limiting amplifier circuit configured to receive the voltage differential signal and to apply a gain to the voltage differential signal to generate an amplified signal that includes the modulated out-of-band data signal; and
   a demodulation circuit electrically coupled to the limiting amplifier circuit and configured to demodulate the modulated out-of-band data signal included in the amplified signal.

2. The optical receiver of claim 1, the photodiode comprising an anode and a cathode, further comprising a stabilizer circuit electrically coupled between the cathode and the plurality of current mirror circuits.

3. The optical receiver of claim 2, wherein the stabilizer circuit is configured to stabilize a voltage on the cathode.

4. The optical receiver of claim 1, further comprising an analog-to-digital converter electrically coupled between the limiting amplifier circuit and the demodulation circuit.

5. The optical receiver of claim 4, wherein the analog-to-digital converter is configured to sample the amplified signal.

6. The optical receiver of claim 2, wherein the plurality of current mirror circuits include a first current mirror circuit with first and second transistors and a second current mirror circuit with third and fourth transistors, wherein gates of the first and second transistors are electrically coupled to the cathode and drains of the first, second, third and fourth transistors are electrically coupled to the limiting amplifier circuit.

7. The optical receiver of claim 6, further comprising a biasing circuit electrically coupled between the drain of the fourth transistor and a gate and the drain of the third transistor.

8. The optical receiver of claim 7, wherein the biasing circuit is configured to control a voltage and/or a current in the plurality of current mirror circuits.

9. The optical receiver of claim 6, further comprising a filter circuit electrically coupled to the fourth transistor and a gate and the drain of the third transistor.

10. The optical receiver of claim 9, wherein the electrical signal includes a direct current portion, and the filter circuit is configured to extract the modulated out-of-band data signal.

11. A method to detect an out-of-band signal, the method comprising:
    receiving an electrical signal comprising an alternating current (AC) portion and a direct current (DC) portion, wherein the AC portion includes modulated out-of-band data carried by the electrical signal;
    extracting the AC portion of the electrical signal from the DC portion of the electrical signal by creating a voltage differential signal that represents the modulated out-of-band data;
    applying a gain to the extracted voltage differential signal to generate an amplified signal including the modulated out-of-band data; and
    sampling the amplified signal to generate a digital sample that represents the modulated out-of-band data.

12. The method of claim 11, wherein the voltage differential signal is based on a difference in signal power levels between the AC portion and the DC portion of the electrical signal.

13. The method of claim 11, wherein an amplitude of the amplified signal is limited to a particular range and varies based on the AC portion of the electrical signal and not based on the DC portion of the electrical signal.

14. The method of claim 13, wherein the particular range that the amplitude of the amplified signal is limited to is based on a power range that can be received by an analog-to-digital convertor.

15. The method of claim 11, further comprising generating the electrical signal based on an optical signal.

16. The method of claim 11, wherein extracting the AC portion of the electrical signal comprises:

averaging a voltage based on a current that includes the modulated out-of-band data carried by the electrical signal to generate an averaged voltage; and extracting a difference between the averaged voltage and a voltage of the electrical signal.

17. An out-of-band signal detector comprising:

a first node configured to receive an alternating current (AC) portion and a direct current (DC) portion of an electrical signal, wherein the AC portion includes modulated out-of-band data carried by the electrical signal;

a current to voltage processing circuit configured to extract the AC portion of the electrical signal from the DC portion of the electrical signal by creating a voltage differential signal that represents the modulated out-of-band data;

a limiting amplifier circuit electrically configured to receive the extracted voltage differential signal to generate an amplified signal including the modulated out-of-band data; and an analog-to-digital convertor circuit configured to sample the amplified signal and to generate a digital sample that represents the modulated out-of-band data.

18. The out-of-band signal detector of claim 17, wherein the voltage differential signal is based on a difference in signal power levels between the AC portion and the DC portion of the electrical signal.

19. The out-of-band signal detector of claim 17, further comprising:

a digital demodulation circuit configured to demodulate the modulated out-of-band data included in the amplified signal; and a biasing circuit configured to control a voltage and/or current in a plurality of current mirror circuits.

20. The out-of-band signal detector of claim 17, wherein the limiting amplifier circuit generates the amplified signal to be within a power range that can be received by the analog-to-digital convertor circuit.

* * * * *